(12) United States Patent
Ayazi et al.

(10) Patent No.: US 8,354,332 B2
(45) Date of Patent: *Jan. 15, 2013

(54) METHODS OF FORMING MICRO-ELECTROMICHANICAL RESONATORS HAVING BORON-DOPED RESONATOR BODIES CONTAINING EUTECTIC ALLOYS

(75) Inventors: Farrokh Ayazi, Atlanta, GA (US); Ashwin Samarao, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 449 days.

This patent is subject to a terminal disclaimer.

(21) Appl. No.: 12/570,623

(22) Filed: Sep. 30, 2009

(65) Prior Publication Data

US 2010/0127596 A1 May 27, 2010

Related U.S. Application Data

(60) Provisional application No. 61/118,074, filed on Nov. 26, 2008, provisional application No. 61/186,477, filed on Jun. 12, 2009.

(51) Int. Cl.
*H02N 11/00* (2006.01)
*H01L 21/22* (2006.01)

(52) U.S. Cl. ........................ 438/510; 310/300
(58) Field of Classification Search .................. 438/510; 310/300
See application file for complete search history.

(56) References Cited

U.S. PATENT DOCUMENTS

| 6,139,759 | A | * | 10/2000 | Doezema et al. ............... 216/11 |
| 6,381,022 | B1 | | 4/2002 | Zavracky |
| 7,236,066 | B2 | | 6/2007 | Ebuchi |
| 7,268,646 | B2 | | 9/2007 | Lutz et al. |
| 7,332,411 | B2 | | 2/2008 | McKinnell et al. |
| 7,675,389 | B2 | | 3/2010 | Yamakawa et al. |
| 8,061,013 | B2 | * | 11/2011 | Ayazi et al. ................... 29/592.1 |
| 2001/0029781 | A1 | | 10/2001 | Tai et al. |
| 2002/0074897 | A1 | | 6/2002 | Ma et al. |
| 2005/0242904 | A1 | | 11/2005 | Lutz et al. |
| 2007/0261497 | A1 | * | 11/2007 | O'Brien et al. ................. 73/724 |
| 2007/0267708 | A1 | * | 11/2007 | Courcimault ................. 257/414 |
| 2010/0127596 | A1 | | 5/2010 | Ayazi et al. |

(Continued)

FOREIGN PATENT DOCUMENTS

EP 2359475 8/2011

(Continued)

OTHER PUBLICATIONS

Hsu et al., "Frequency Trimming for MEMS Resonator Oscillators." Discera Inc., Ann Arbor, Michigan whsu@discera.com (2007).

(Continued)

*Primary Examiner* — Wai Sing Louie
*Assistant Examiner* — Robert Carpenter
(74) *Attorney, Agent, or Firm* — Myers Bigel Sibley & Sajovec, P.A.

(57) ABSTRACT

A micro-electromechanical resonator includes a resonator body having a semiconductor region therein doped with boron to a level greater than about $1 \times 10^{18}$ cm$^{-3}$ and even greater than about $1 \times 10^{19}$ cm$^{-3}$, in order to obtain reductions in the temperature coefficient of frequency (TCF) of the resonator over a relatively large temperature range. Still further improvements in TCF can be achieved by degenerately doping the resonator body with boron and/or by boron-assisted aluminum doping of the resonator body.

11 Claims, 8 Drawing Sheets

U.S. PATENT DOCUMENTS

2010/0127798 A1    5/2010    Ayazi et al.

FOREIGN PATENT DOCUMENTS

JP    04-035404    2/1992

OTHER PUBLICATIONS

International Preliminary Report on Patentability Corresponding to International Application No. PCT/US2009/065489; Date of Mailing: Jun. 9, 2011; 10 pages.

Pourkamali et al., "Low-Impedance VHF and UHF Capacitive Silicon Bulk Acoustic Wave Resonators—Part I: Concept and Fabrication," IEEE Transactions on Electron Devices 54:2017-2023 (2007).

Samarao et al., "Post-Fabrication Electrical Trimming of Silicon Bulk Acoustic Resonators Using Joule Heating," $22^{nd}$ IEEE International Conference on Micro Electro Mechanical Systems MEMS 2009, Sorrento, Italy. Jan. 25-29, 2009.

Sundaresan et al., "Electronically Temperature Compensated Silicon Bulk Acoustic Resonator Reference Oscillators," IEEE Journal of Solid-State Circuits 42:1425-1434. (2007).

Courcimault et al., "High-Q Mechanical Tuning of MEMS Resonators Using a Metal Deposition—Annealing Technique," The $13^{th}$ International Conference on Solid-State Sensors, Actuators and Microsystems, Seoul, Korea, Jun. 5-9, 2005, pp. 875-878.

Hsu et al., "In Situ Localized Annealing for Contamination Resistance and Enhanced Stability in Nickel Micromechanical Resonators," $10^{th}$ International Conference on Solid-State Sensors and Actuators, Sendai, Japan, Jun. 7-10, 1999, pp. 932-935.

Invitation to Pay Additional Fees, International Application No. PCT/US2009/065489, Jun. 2, 2010.

Krause et al., "Determination of aluminum diffusion parameters in silicon," Journal of Applied Physics, vol. 91, No. 9, May 1, 2002, pp. 5645-5649.

Notification of Transmittal of the International Search Report and the Written Opinion of the International Searching Authority, or the Declaration, PCT/US2009/065489, Jul. 12, 2010.

\* cited by examiner

METHODS OF FORMING MICRO-ELECTROMICHANICAL RESONATORS HAVING BORON-DOPED RESONATOR BODIES CONTAINING EUTECTIC ALLOYS

CROSS-REFERENCE TO RELATED APPLICATION

This application is related to U.S. application Ser. No. 12/534,401, filed Aug. 3, 2009, the disclosure of which is hereby incorporated herein by reference.

REFERENCE TO PRIORITY APPLICATIONS

This application claims priority to U.S. Provisional Application Ser. Nos. 61/118,074, filed Nov. 26, 2008, and 61/186,477, filed Jun. 12, 2009, the disclosures of which are hereby incorporated herein by reference.

STATEMENT REGARDING FEDERALLY SPONSORED RESEARCH OR DEVELOPMENT

This invention was made with Government support under Contract No. W15P7T-06-C-P635 awarded by the United States Army. The Government may have certain rights in the invention.

FIELD OF THE INVENTION

The present invention relates to integrated circuit devices and, more particularly, to micro-electromechanical devices and methods of forming same.

BACKGROUND OF THE INVENTION

Micro-electromechanical (MEMs) resonators can provide small form factor, ease of integration with conventional semiconductor fabrication techniques and high f·Q products. High frequency and high-Q width-extensional mode silicon bulk acoustic resonators (SiBARs) and film bulk acoustic wave resonators (FBARs) have demonstrated atmospheric Q factors in excess of 10,000 at or above 100 MHz, with moderate motional resistances. Such resonators are disclosed in an article by S. Pourkamali et al., entitled "Low-Impedance VHF and UHF Capacitive Silicon Bulk Acoustic Wave Resonators—Part I: Concept and Fabrication," IEEE Trans. On Electron Devices, Vol. 54, No. 8, pp. 2017-2023, August (2007), the disclosure of which is hereby incorporated herein by reference.

The resonant frequency of silicon micro-electromechanical resonators is dependent on the physical dimensions of the resonating structure. This causes the resonant frequency of those resonators to deviate from a designed target value in response to variations in photolithography, etching and film thickness. For example, as described in an article by G. Casinovi et al., entitled "Analytical Modeling and Numerical Simulation of Capacitive Silicon Bulk Acoustic Resonators," IEEE Intl. Conf. on Micromechanical Systems (2009), a 2 µm variation in thickness of a 100 MHz width-extensional mode SiBAR can cause a 0.5% variation in its center frequency, while lithographic variations of ±0.1 µm in the width of the resonator can cause an additional 0.5% variation in frequency.

To address these variations in resonant frequency, techniques have been developed to tune the resonant frequency of a MEMs resonator. One such technique to reduce a resonant frequency of a resonator is to deposit a mass loading layer (e.g., metal layer) on a surface of a resonating structure. This technique is disclosed in an article by C. Courcimault et al., entitled "High-Q Mechanical Tuning of MEMS Resonators Using a Metal Deposition—Annealing Technique," Transducers, pp. 875-878 (2005).

SUMMARY OF THE INVENTION

A micro-electromechanical resonator according to embodiments of the invention includes a resonator body having a semiconductor region therein doped with boron to a level greater than about $1\times10^{16}$ cm$^{-3}$ and even greater than about $1\times10^{19}$ cm$^{-3}$, in order to obtain reductions in the temperature coefficient of frequency (TCF) of the resonator over a relatively large temperature range. Still further improvements in TCF can be achieved by degenerately doping the resonator body with boron.

In alternative embodiments of the invention, an initial doping of a resonator body with boron is performed to facilitate the relatively fast and uniform incorporation of aluminum into the resonator body to achieve further reductions in TCF. In particular, whereas exclusively boron doping of MEMs resonators may be limited to resonators having relatively thin resonator bodies, boron-assisted aluminum doping may be used to achieve substantial reductions in TCF in MEMs resonators having relatively thick resonator bodies that experience acoustic wave propagation during resonant frequency operation. According to some of these embodiments of the invention, a micro-electromechanical resonator may include an electrically-trimmed resonator body having at least one stiffness-enhanced boron and aluminum doped silicon region therein. This resonator body may be anchored on opposite sides to a substrate having a recess therein underlying a bottom surface of the resonator body. In the event the MEMs resonator is a capacitive resonator, then a pair of electrodes may be provided adjacent opposing sides of the resonator body.

According to still further embodiments of the invention, a method of trimming a resonant frequency of a micro-electromechanical resonator may include heating a boron-doped semiconductor resonator body having at least one mass-loading metal layer thereon for a first duration sufficient to convert at least a portion of the semiconductor resonator body into a eutectic alloy comprising metal from the at least one mass-loading metal layer. In some of these embodiments of the invention, the at least a portion of the semiconductor resonator body can be degenerately doped with boron. This heating of the resonator body may be performed by passing a current therethrough using a pair of supports between the resonator body and a surrounding substrate to support current flow.

Still further embodiments of the invention include methods of fabricating a micro-electromechanical resonator by forming a boron-doped resonator body opposite a recess in a semiconductor substrate and providing an aluminum metal layer on a surface of the resonator body. The boron-doped resonator body is then packaged within a sealed chamber that shares an ambient with the recess in the semiconductor substrate. The packaged boron-doped resonator body is then heated (e.g., using resistive heating) for a sufficient duration to convert at least a portion of the boron-doped resonator body into a eutectic alloy comprising aluminum from the aluminum metal layer. This heating may be achieved by passing a current through first and second opposing supports that anchor the resonator body above the recess in the substrate.

DESCRIPTION OF PREFERRED EMBODIMENTS

Figure 1:
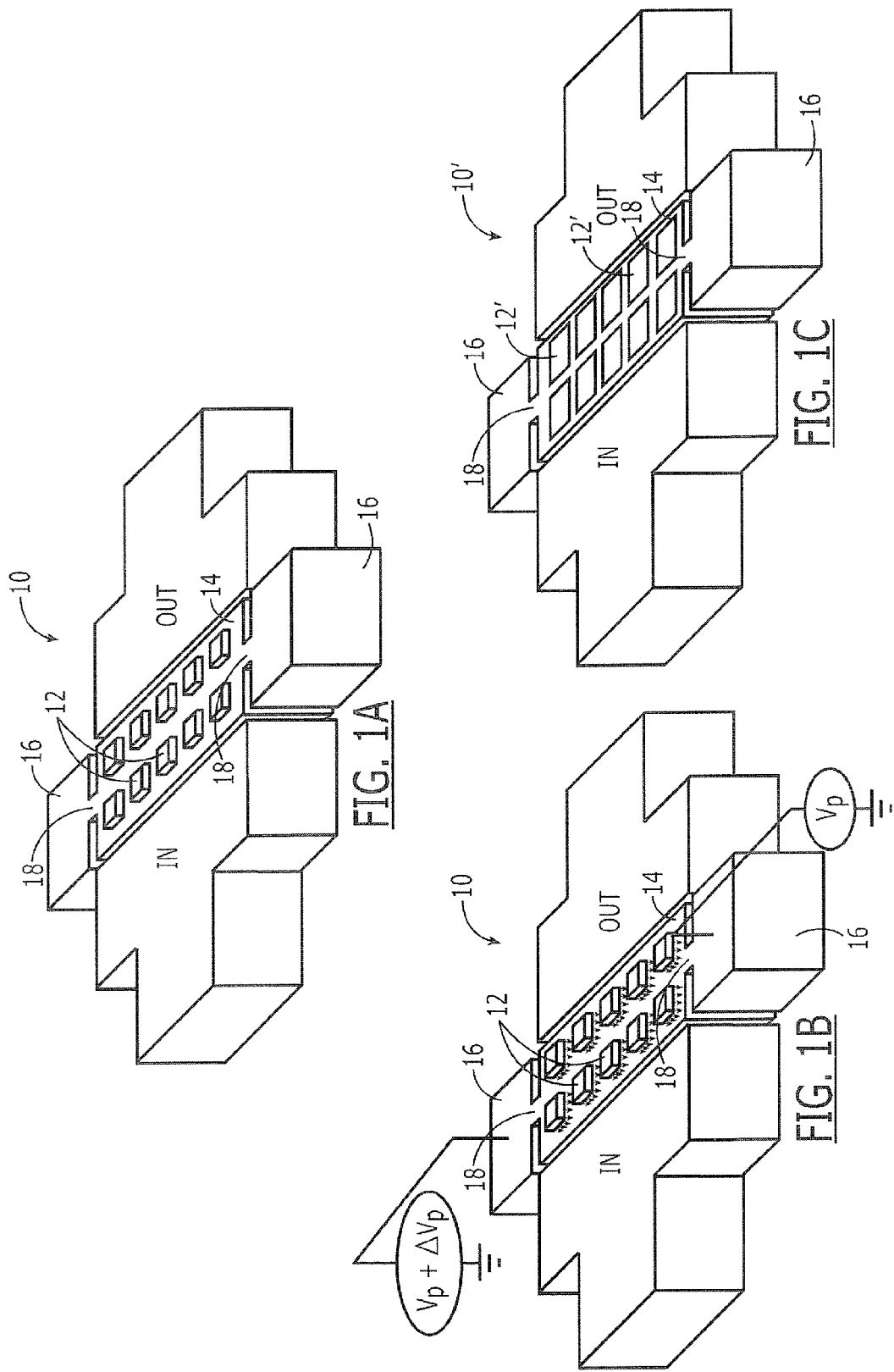
FIGS. 1A-1C are perspective views of SiBAR structures that illustrate methods of performing post-fabrication electrical trimming using Joule heating.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods of performing post-fabrication electrical trimming of micro-electromechanical resonators according to some embodiments of the invention are illustrated by FIGS. 1A-1C. In particular, FIG. 1A illustrates a mass-loaded SiBAR 10 having two rows of spaced-apart metal islands 12 on an upper surface of a resonator body 14. This resonator body 14, which is suspended between opposing input (IN) and output (OUT) terminals, is attached to a surrounding substrate 16 by a pair of narrow supports 18. The metal islands 12 (e.g., Au or Al islands) may be formed as thin-film metal patterns by evaporating and then patterning a metal layer on the upper surface of the resonator body 14. This metal layer may be formed to have a thickness in a range from about 10 Å to about 1500 Å. The SiBAR 10 may then be packaged within a sealed chamber using MEMs packaging techniques. Some of these packaging techniques are disclosed in U.S. application Ser. No. 12/351,020, filed Jan. 9, 2009, the disclosure of which is hereby incorporated herein by reference. After the SiBAR 10 is packaged, a resonant frequency of the resonator body 14 may be electrically trimmed using Joule (i.e., resistive) heating. In particular, as illustrated by FIG. 1B, the resonator body 14 of the SiBAR 10 is heated by passing a sufficiently large current therethrough during a post-packaging electrical calibration operation. This current may be generated by establishing a voltage difference of $\Delta V_p$ across the opposing ends of the resonator body 14, as illustrated. Relatively high current densities resulting from a relatively small cross-sectional area of the resonator body 14 can cause enough Joule heating to enable the out-diffusion of metal (e.g., gold, aluminum) from the metal islands 12 into the bulk of the resonator body 14. As illustrated by FIG. 1C, this out-diffusion converts the metal islands 12 into metal film residues 12' within a packaged SiBAR 10'. One advantage of using gold (Au) instead of another metal, such as aluminum, is that gold diffuses into silicon at a relatively low eutectic temperature of the silicon-gold binary system (e.g., 360° C.), which is much lower than the individual melting temperature of gold (1064° C.) and silicon (1414° C.).

To calculate the temperature of a 100 MHz SiBAR for various durations of Joule heating with a given cross-sectional area (e.g., 41.5 µm×20 um) and resistivity (0.01 Ω-cm), an electro-thermal model based on conservation of energy can be used. Using this model, a silicon resonator body of these dimensions can be heated to a eutectic temperature in less than five minutes using currents of 600 mA or higher. However, the maximum value of the current is limited by the relatively small cross-sectional area of its two narrow supports, which are shown as supports 18 in FIGS. 1A-1C. These supports are designed to be as narrow as possible to reduce acoustic loss and achieve high-Q, but such narrow dimensions can cause a sufficiently large increase in current densities near the support regions and even melt the supports. Based on experiment, a current of 30 mA was selected to cause the required Joule heating (for gold diffusion) within a reasonable amount of time, but without affecting the performance of the SiBAR under test.

Figure 2:
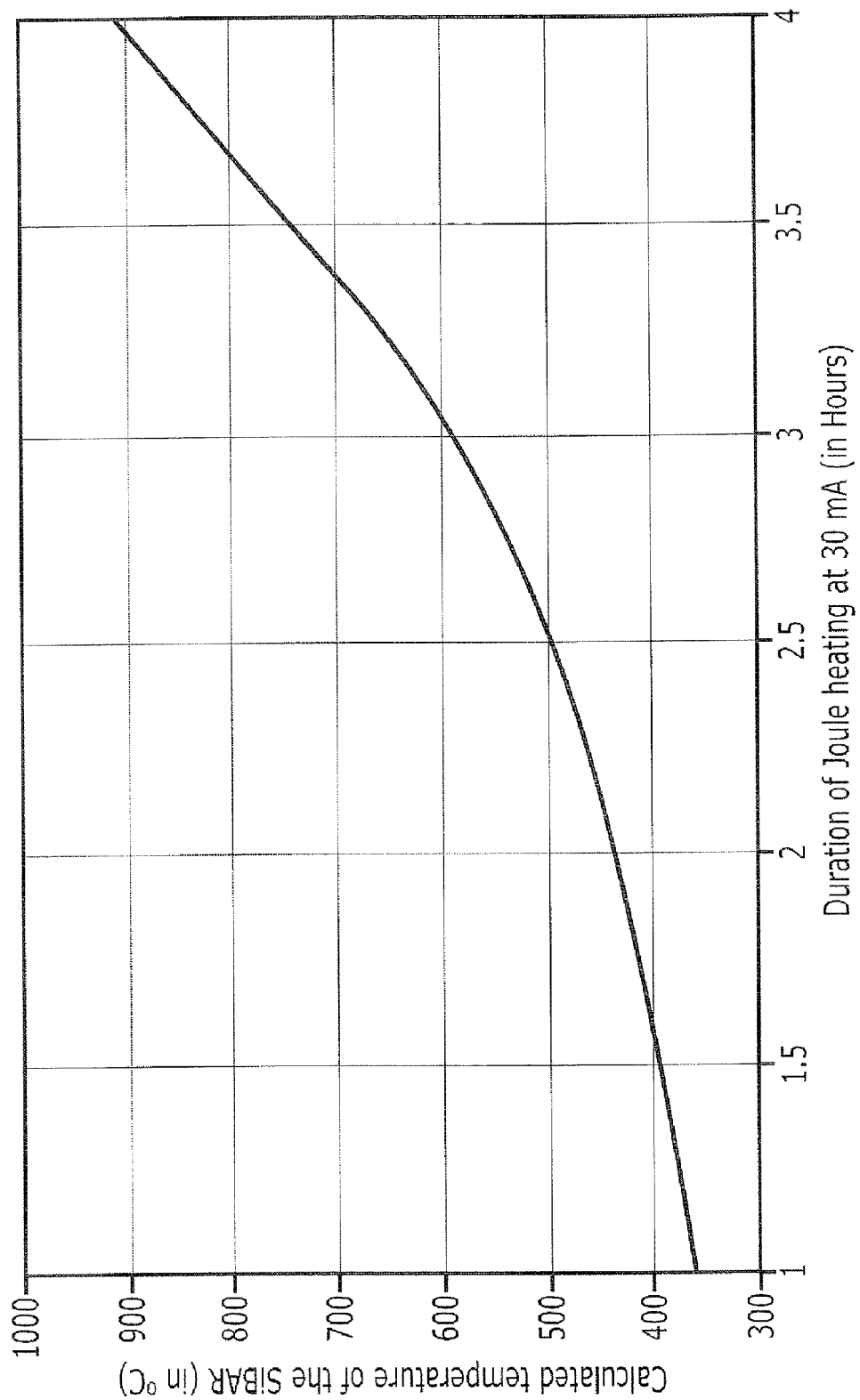
FIG. 2 is a graph illustrating calculated resonator body temperature versus a duration of Joule heating at 30 mA for a packaged 100 MHz SiBAR having a cross-sectional area of 41.5 μm×20 μm and resistivity of 0.01 Ω-cm.

FIG. 2 illustrates a graph of calculated resonator body temperature (° C.) versus a duration of Joule heating for a packaged 100 MHz SiBAR having a cross-sectional area of 41.5 µm×20 µm and resistivity of 0.01 Ω-cm. As illustrated, about 1 hour of Joule heating heats the SiBAR to a temperature of about 363° C., which will facilitate the formation of a silicon-gold eutectic. Gold from the thin gold islands will diffuse into the bulk of the resonator body to form a eutectic alloy having about 19% silicon by atomic weight. As gold diffuses into silicon, the gold atoms form a metastable gold-silicide, wherein gold moves into interstitials within the silicon lattice, thus breaking Si—Si bonds and creating voids owing to its relatively large atomic size. Upon further heating, supersaturation occurs followed by decomposition of the gold-silicide to a more stable polysilicon with intermediate voids and Au—Si bonds, which are stronger than the Si—Si bonds they replace. As a result, the gold diffusion increases the stiffness of the resonator body upon cooling. Voids introduced into the lattice of the resonator body in response to the gold diffusion also reduce its density. This reduction in density and the increase in stiffness operate collectively to increase the acoustic velocity of the resonator body, which corresponds to a higher resonant frequency that can be carefully controlled based on a degree of mass loading and Joule heating.

Figure 3A:
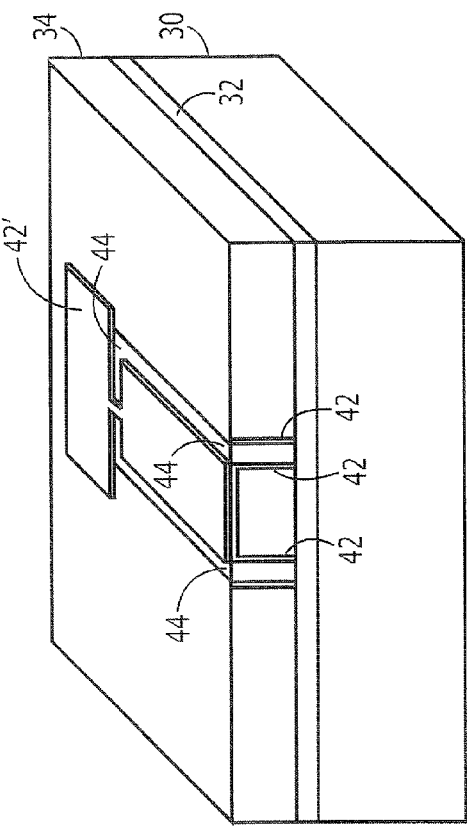
FIGS. 3A-3D are perspective views of intermediate structures that illustrate methods of forming SiBARs according to some embodiments of the invention.

FIGS. 3A-3D are perspective views of intermediate structures that illustrate methods of forming SiBARs 70 according to some embodiments of the invention. For ease of understanding from a perspective view, these figures omit a support 38 and $V_p$ pad 52 from one end of a resonator body 40. As shown by FIG. 3A, a silicon-on-insulator (SOI) substrate is illustrated as including a single-crystal silicon substrate 30, a buried electrically insulating layer 32 on the substrate 30 and a silicon active layer 34 on the buried electrically insulating layer 32. This silicon active layer 34 may have a thickness of about 20 um, for example, and the buried electrically insulating layer 32 may be a silicon dioxide layer having a thickness of about 2 µm. The silicon active layer 34 is then selectively etched for a sufficient duration to define wraparound trenches 36 therein. These trenches 36 expose portions of the underlying buried layer 32 and define a rectangular-shaped resonator body 40, which is attached (i.e., anchored) to the surrounding active layer 34 by a pair of narrow supports 38. This deep etching step (e.g., DRIE) may be performed using an oxide mask (not shown). As described herein, the deep etching step may be used to define a resonator body that is 41.5 µm wide and 415 µm long, with supports 38 that are 3 µm wide and 6 µm long.

Referring still to FIG. 3A, a thermal oxidation step is performed following the trench forming step. This oxidation step results in the formation of a thermal oxide layer 42 on an upper surface of the silicon active layer 34 and on sidewall surfaces of the silicon active layer 34 in the trenches 36, and on upper and sidewall surfaces of the resonator body 40. This thermal oxide layer 42 may have a thickness of about 1000 Å, which defines the capacitive gap of the SiBAR. The trenches 36 are then filled with doped polysilicon electrode extensions 44. These extensions 44 may be formed using a low pressure chemical vapor deposition (LPCVD) technique that is followed by an etch-back step to remove exposed portions of the deposited polysilicon layer from an upper surface of the thermal oxide layer 42.

Figure 3C:
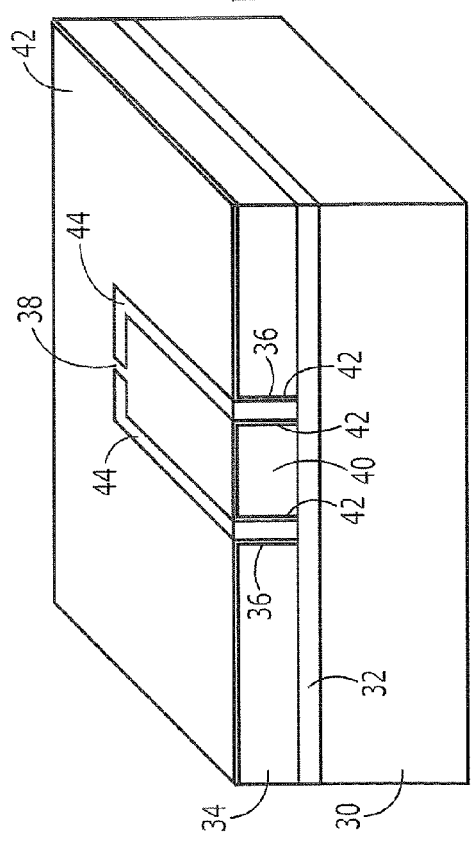
Figure 3B:
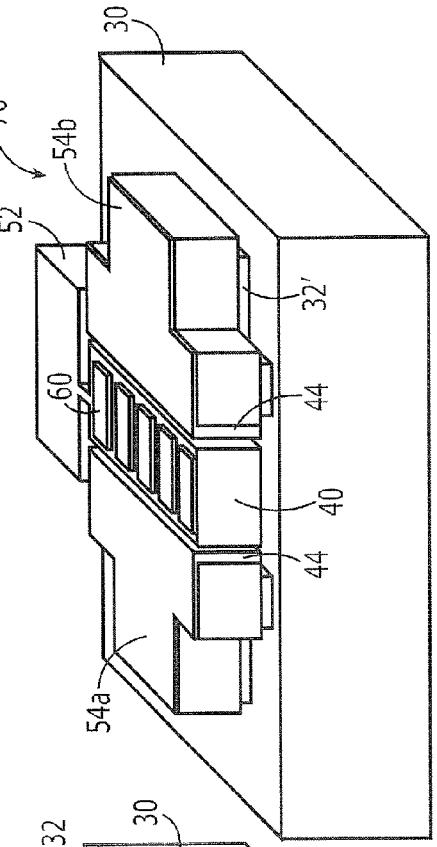
Figure 3D:
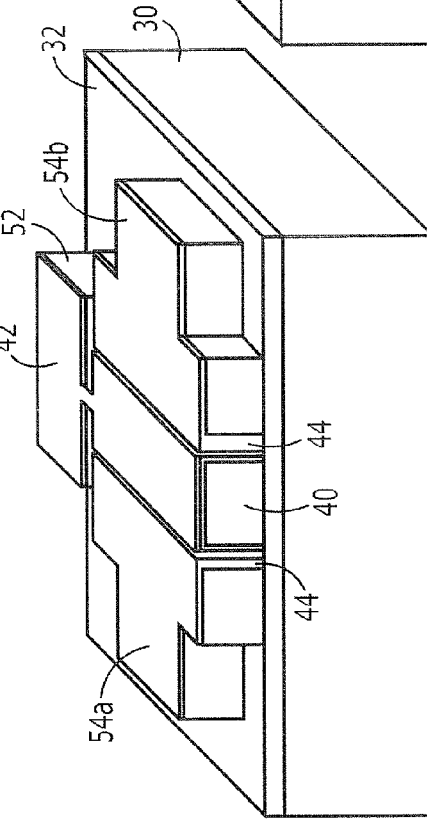

Referring now to FIG. 3B, the thermal oxide layer 42 is selectively patterned into a pad oxide pattern 42' that is used to define the shape of polarization voltage ($V_p$) electrodes/pads 52 illustrated by FIG. 3D. A second doped LPCVD polysilicon layer is then deposited and patterned to define input/output electrodes 54a, 54b, as illustrated by FIG. 3C. This patterning step is continued to selectively remove portions of the silicon active layer 34 and thereby electrically isolate the input/output and $V_p$ electrodes on top of the buried insulating layer 32. Referring now to FIG. 3D, a blanket layer of gold is evaporated onto the resonator body 40 and patterned into gold islands 60 using a lift-off process. Then, exposed portions of the pad oxide pattern 42' and the buried insulating layer 32 are removed using hydrofluoric acid (HF) to release and suspend the resonator body 40 opposite the silicon substrate 30 and expose a capacitive gap between the input/output electrodes 54a, 54b (and polysilicon electrode extensions 44) and the resonator body 40. The use of hydrofluoric acid to etch through the buried insulating layer 32 also results in the formation of buried insulating patterns 32' extending underneath the input/output electrodes 54a, 54b, as illustrated. This resonator 70 of FIG. 3D may then be packaged using conventional packaging techniques or those disclosed in the aforementioned '020 application.

Figure 4:
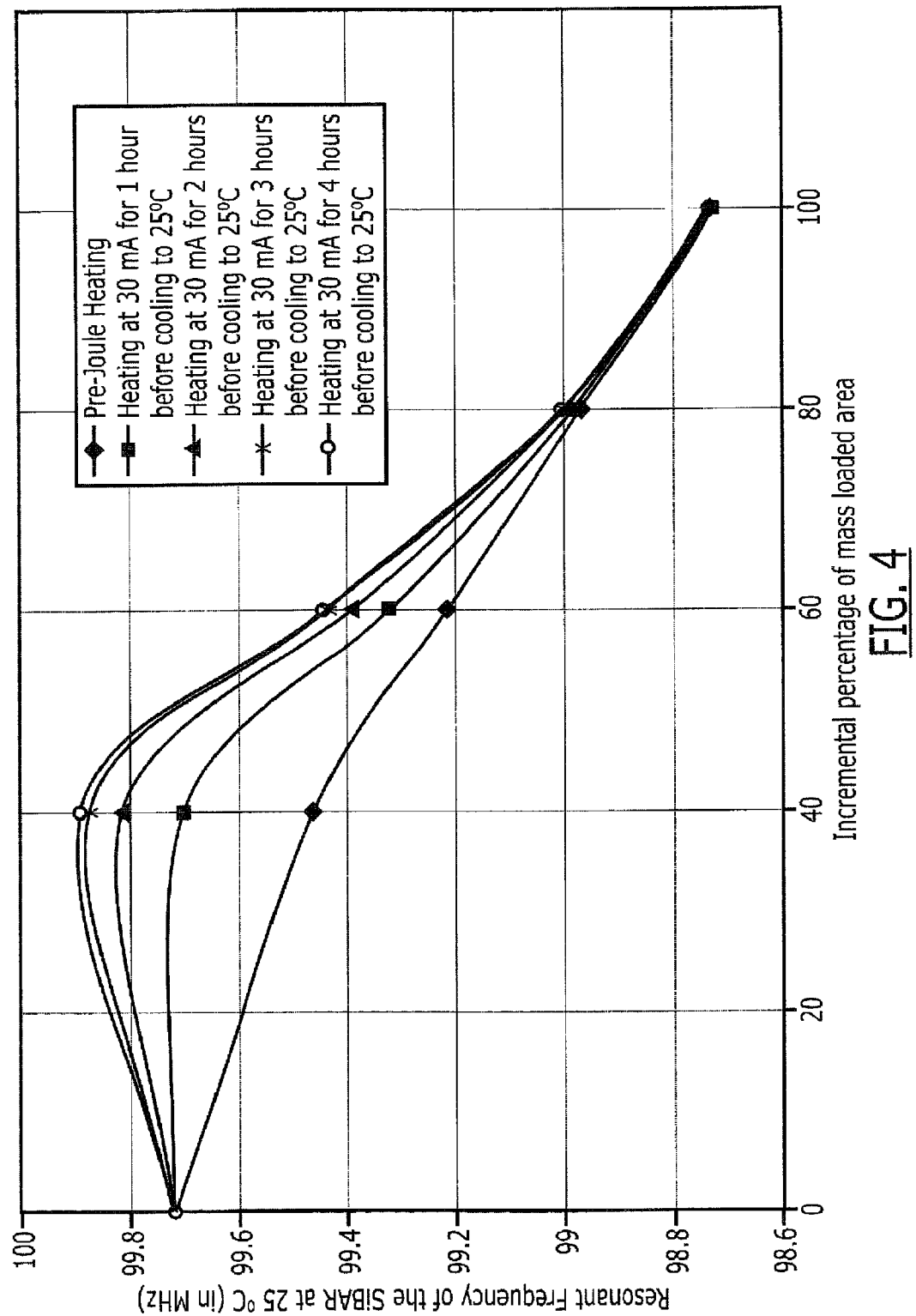
FIG. 4 is a graph of measured resonant frequencies of the SiBAR of FIG. 3D versus incremental percentage of mass loading on the top surface of the resonator body, before and after electrical trimming using Joule heating with a 30 mA current.

FIG. 4 is a graph of measured resonant frequencies of the SiBAR 70 of FIG. 3D versus incremental percentage of mass loading on the top surface of the resonator body, before and after electrical trimming using Joule heating with a 30 mA current. In FIG. 4, a curve labeled "Pre-Joule Heating" shows a downward shift in resonant frequency due to the mass loading with various pattern densities of 150 nm thick gold. The 100% mass loading point on the curves illustrates a downward shift of 996.2 kHz in resonant frequency. FIG. 4 further illustrates that one hour of Joule heating at 30 mA shifts up the 40% mass loaded SiBAR (with eighteen relatively small gold islands thereon) by 240 kHz and shifts up the 80% mass loaded SiBAR (with six larger gold islands) by 17 kHz. This suggests that the localized heating of the SiBAR diffuses smaller islands of gold more readily than larger islands. FIG. 4 also illustrates that for a given level of mass loading, the percentage increase in resonant frequency decreases with increasing duration of Joule heating. This decrease is consistent with the fact that gold diffusion mainly occurs during the first hour of Joule heating when the eutectic temperature is reached. Subsequent heating leads to a more stable resonating structure, which will correspond to smaller frequency shifts. Accordingly, four hours of Joule heating shifts up the 40% and 80% mass loaded SiBARs by only 430 kHz and 35 kHz, respectively. A shift of 430 kHz over four hours corresponds to a trimming rate of approximately 2 kHz per minute, which makes very precise and controlled electrical trimming possible.

The 40% mass loaded SiBAR is designed to provide a resonant frequency of 99.6 MHz (i.e., a downshift of 400 kHz from 100 MHz). But, it can be seen from FIG. 4 that variations in the SiBAR fabrication and also in the thickness of the deposited gold can offset the resonant frequency to 99.46 MHz. The electrical trimming time needed to shift up this as-fabricated resonant frequency of 99.46 MHz to the designed 99.6 MHz level can be calculated to be 35 minutes from FIG. 4. FIG. 4 also illustrates that the 40% mass loaded SiBAR can exceed the resonant frequency of an otherwise equivalent unloaded SiBAR with longer Joule heating (e.g., greater than one hour). This result suggests that the formation of a structure with stronger Au—Si bonds and with less dense packing because of diffusion-induced voids provides a higher acoustic velocity than crystalline silicon.

Figure 5A:
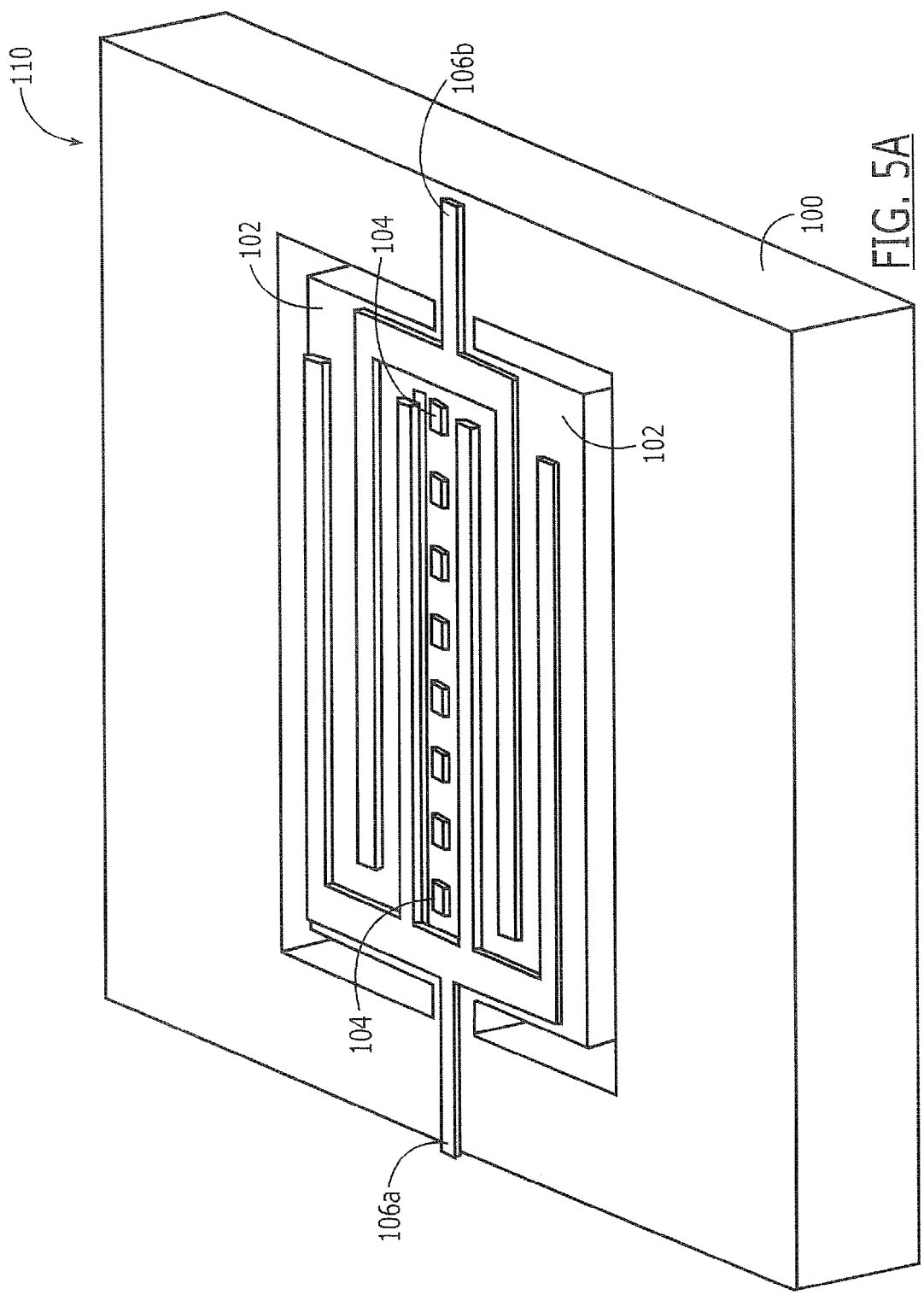
FIGS. 5A-5B are perspective views of film bulk acoustic resonators (FBARs) according to additional embodiments of the invention.
Figure 5B:
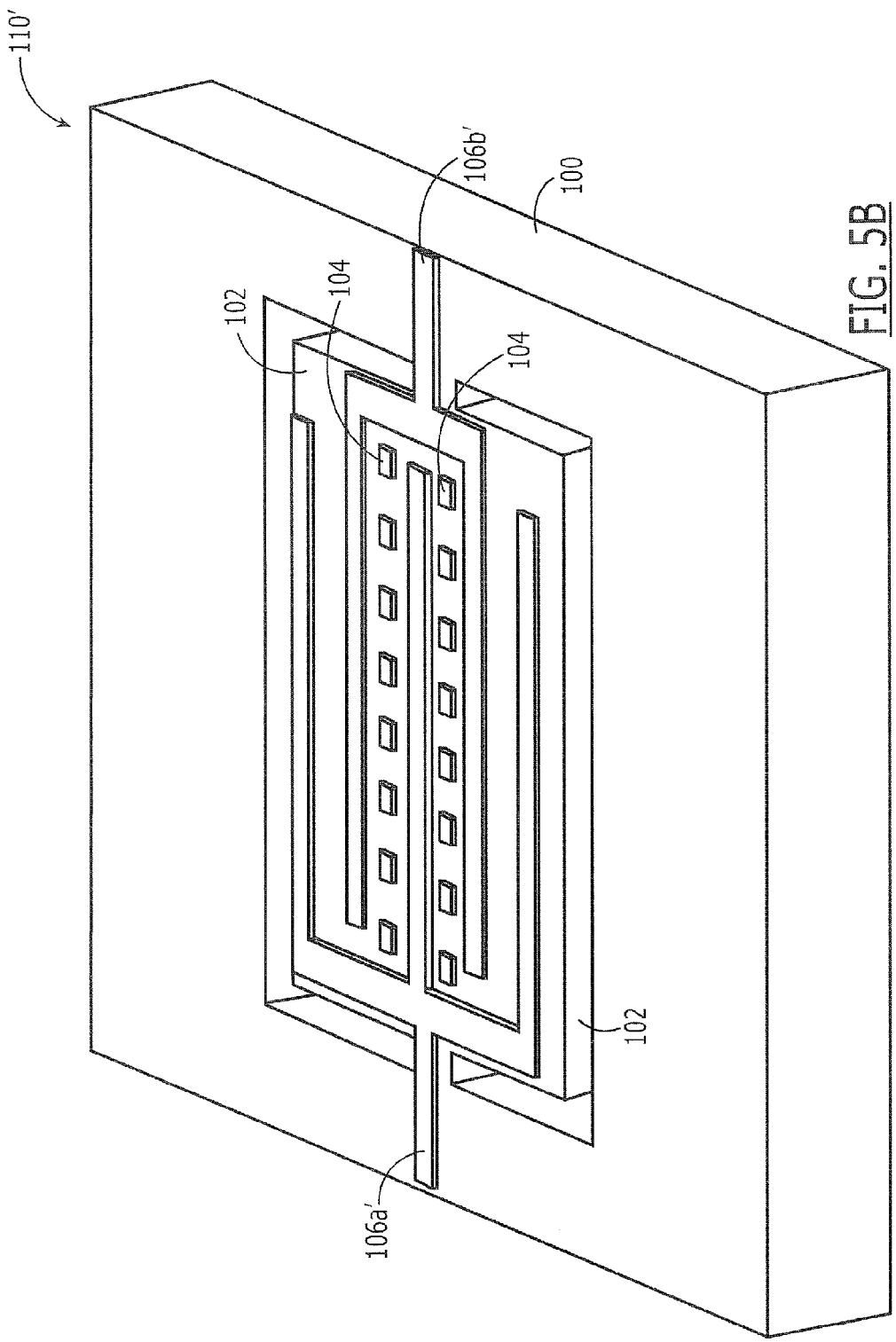

FIGS. 5A-5B illustrate MEMs resonators according to additional embodiments of the present invention. In particular, FIGS. 5A-5B are perspective views of film bulk acoustic resonators (FBARs) 110 and 110', which include a resonator body 102 suspended by anchors/supports to a supporting substrate 100. These resonator bodies 102 may include a plurality of layers of different materials, including at least one piezoelectric layer and input/output electrodes (106a, 106b) and (106a', 106b') on the piezoelectric layer. In particular, the resonator bodies 102 and electrodes may be formed as more fully disclosed in U.S. application Ser. Nos. 12/393,566, filed Feb. 26, 2009 and 12/363,142, filed Jan. 30, 2009, the disclosures of which are hereby incorporated herein by reference.

As described hereinabove, the MEMs resonators 110 and 110' further include a plurality of spaced-apart metal islands (e.g., gold islands) 104 disposed directly on an upper surface of the resonator bodies 102. As shown by FIG. 5A, the metal islands 104 can be located along a longitudinal axis of the resonator body 102 extending between the opposing supports that attach the resonator body 102 to the surrounding substrate 100. In FIG. 5A, the metal islands 104 extend between adjacent fingers of a first electrode 106a. In FIG. 5B, the metal islands 104 extend between fingers of the first and second electrodes 106a' and 106b', as illustrated. Other configurations of the metal islands 104 relative to the electrodes are also possible.

Figure 6:
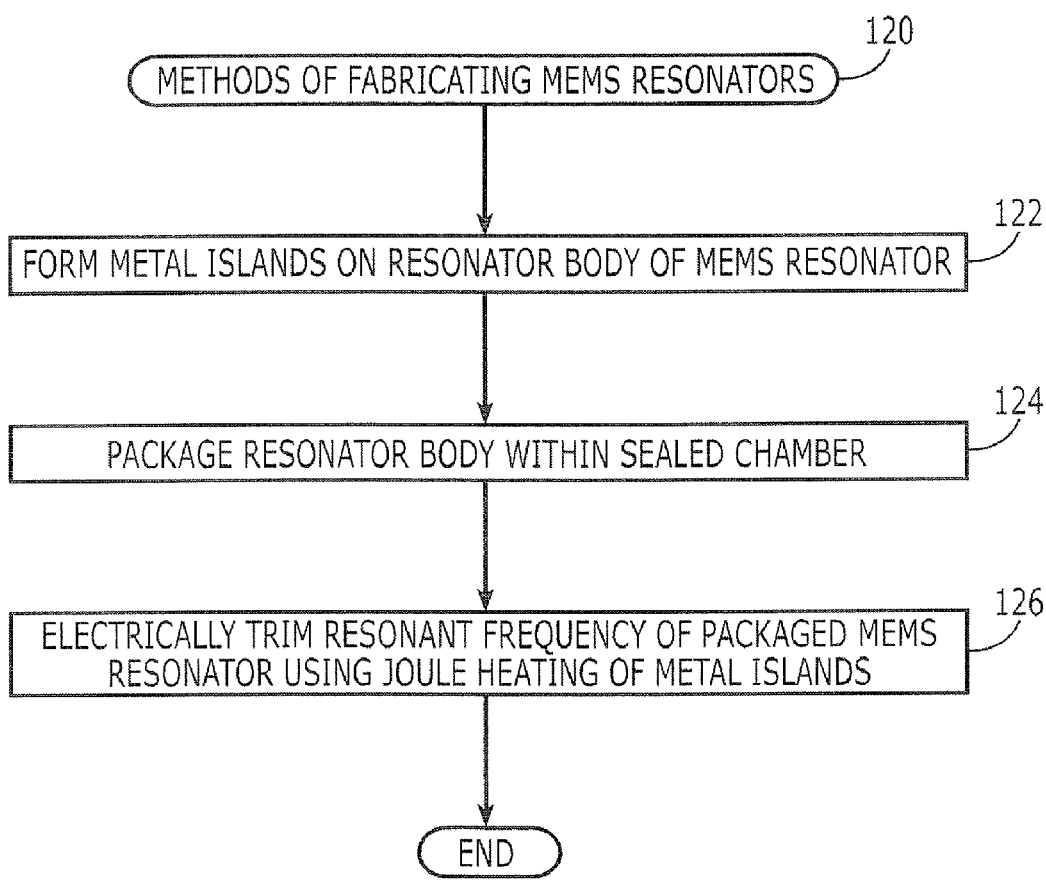
FIG. 6 is a flow-diagram of steps that illustrate methods of fabricating MEMs resonators according to embodiments of the invention.

FIG. 6 is a flow diagram of steps that illustrates methods 120 of fabricating MEMs resonators according to some embodiments of the present invention, including the embodiments illustrated by FIGS. 3A-3D and 5A-5B. As illustrated by Block 122, these methods 120 include forming a plurality of metal islands on a resonator body of a MEMs resonator. In some of these embodiments of the invention, the resonator body may be formed opposite a recess in a semiconductor substrate and a plurality of spaced-apart metal islands (e.g., gold islands) may be formed on an upper surface of the resonator body. The MEMs resonator is then packaged, Block 124, prior to testing and electrical trimming. In some of these embodiments of the invention, the resonator body may be packaged within a sealed chamber that shares an ambient with the recess in the semiconductor substrate. After packaging, the resonator body is electrically trimmed using Joule heating of the metal islands, Block 126. As described hereinabove, the resonator body is heated for a sufficient duration to convert at least a portion of the resonator body into a eutectic alloy including metal from the metal islands.

The above-described embodiments of the invention may be further enhanced by increasing a permanent strain in the body of a MEMs resonator using boron doping (e.g., degenerate boron doping) and boron-assisted aluminum doping. Although not wishing to be bound by any theory, a boron dopant has a smaller radius than silicon and may be bonded strongly to three of four adjacent silicon atoms when diffused into a silicon lattice within a silicon resonator body. Such an atomic arrangement produces very strong shear strain in the silicon lattice, which may lead to a relatively large permanent separation of the degenerate valence bands therein and a corresponding transfer of holes to a higher energy band. This relatively large permanent separation suggests that any additional band splitting caused by the propagation of acoustic waves within the silicon lattice of a resonator body and/or an increase in resonator operating temperature will have a relatively minimal effect on the temperature coefficient of frequency (TCF) of the MEMs resonator. Moreover, at degenerate levels of boron doping, the acoustic waves generated within the resonator body during resonant frequency operation may be shielded from k-space contours of the valence bands and thereby compensate for the component of TCF that is based on changes in the Young's modulus (E) of silicon.

To verify the benefits of boron doping, SiBARs were fabricated with 100 nm capacitive airgaps using a HARPSS process on a 10 um thick boron-doped silicon wafer, with a starting resistivity of ~$10^{-2}$ Ω-cm and a TCF of −29 ppm/° C. This HARPSS process is more fully described in an article by S. Pourkamali et al., entitled "Low-Impedance VHF and UHF Capacitive SiBARs—Part II: Measurement and Characterization," IEEE Trans. on Electron Devices, Vol. 54, No. 8, pp. 2024-2030, August 2007. The boron dopant density in silicon was increased to ~$7 \times 10^{19}$ cm$^{-3}$ (i.e., ~$10^{-3}$ Ω-cm) by repeated doping using conventional solid boron sources. Moreover, achieving degenerate levels of boron doping at a boron density of ~$2 \times 10^{20}$ cm$^{-3}$ (i.e., <$10^{-4}$ Ω-cm) can require repeated doping using liquid spin-on boron dopant sources, such as those disclosed in an article by C. Iliescu et al., entitled "Analysis of Highly Doping With Boron From Spin-on Diffusing Source," Surface & Coatings Technology, Vol. 198, No. 1-3, pp. 309-311, August 2005.

The 10 um thick silicon wafer with the starting resistivity of ~$10^{-2}$ Ω-cm was processed through five repetitions of a solid boron dope/anneal recipe to reduce the resistivity to ~$10^{-3}$ Ω-cm at which a corresponding TCF of −18.9 ppm/° C. was measured. Six repetitions of liquid boron doping using a spin-on dopant (SOD) source (with a silicon wafer having a starting resistivity of ~$10^{-3}$ Ω-cm) yielded a starting resistivity of about $10^{-4}$ Ω-cm and a reduction in TCF to about −10.5 ppm/° C., but with an increase in resonant frequency caused by a dopant-induced increase in Young's modulus. Changes in the Young's modulus of silicon in response to boron doping are more fully discussed in an article by N. Ono et al., entitled "Measurement of Young's Modulus of Silicon Single Crystal at High Temperature and its Dependency on Boron Concentration Using Flexural Vibration Method," Japanese Journal of Applies Physics, Vol. 39, pp. 368-371, February 2000.

Figure 7:
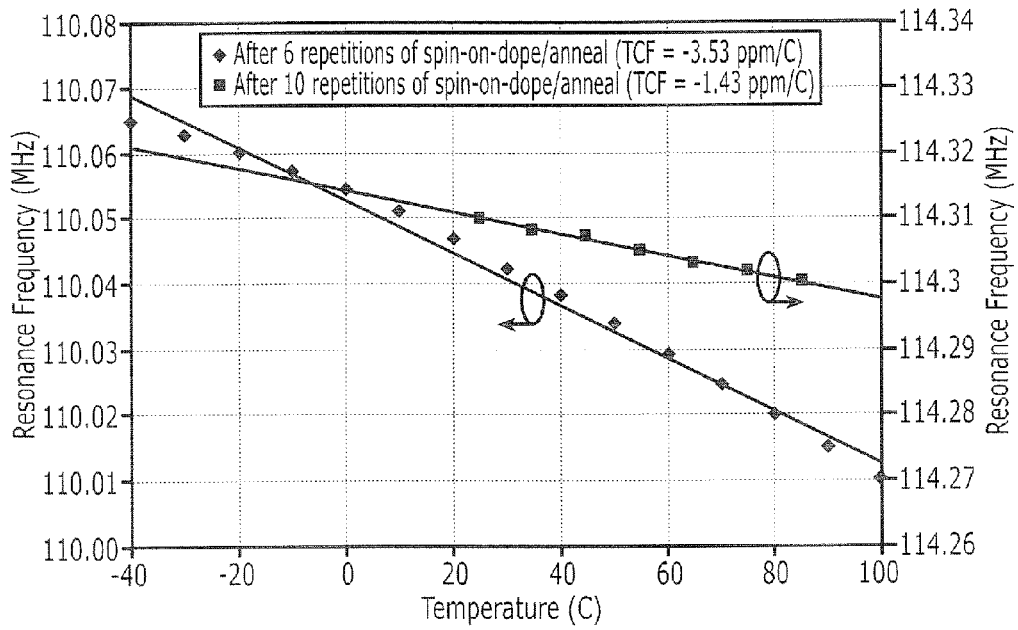
FIG. 7 is a graph of resonance frequency versus temperature for a 5 μm thick SiBAR after six and ten repetitions of boron spin-on-dope/anneal processes.
Figure 8:
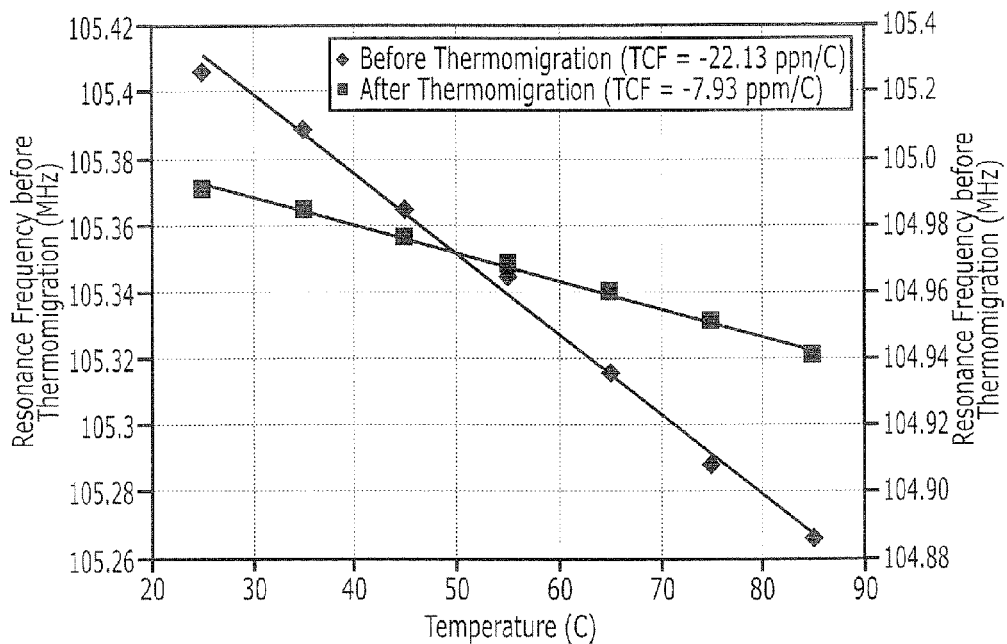
FIG. 8 is a graph of resonance frequency versus temperature for a 20 um thick boron-doped SiBAR before and after thermomigration with 500 Å of aluminum, using a 120 mA heating current for ten minutes.

Because the maximum thickness of a heavily doped boron layer that can be achieved within silicon may be limited to about 7-8 microns, SiBARs having a silicon resonator body thickness of greater than about 8 microns may have a non-uniform boron doping profile therein that precludes lowest possible TCF values. Nonetheless, it can be expected that a thinner but otherwise equivalent SiBAR (e.g., 5 um thick) with a resistivity of $10^{-4}$ Ω-cm may have a TCF that is lower than about −10.5 ppm/° C. For example, as illustrated by FIG. 7, by repeating the liquid boron doping/anneal cycles on a 5 um thick SiBAR, reductions in the TCF to about −1.43 ppm/° C. can be achieved.

According to still further embodiments of the present invention, boron doping can be used to enhance the uniformity and speed of aluminum thermomigration within silicon without significant O-factor degradation using, for example, the techniques described herein with respect to FIGS. 1A-1C. In fact, boron-assisted aluminum doping can be a faster alternative to degenerate boron doping for TCF reduction. As illustrated by FIGS. 1A-1C and 8, the advantages of boron-assisted aluminum doping can be achieved by evaporating a 500 Å thick layer (e.g., single island or multiple islands) of aluminum onto a boron-doped 20 um thick SiBAR with a starting resistivity of ~$10^{-3}$ Ω-cm. Thermomigration is then achieved by passing a current 120 mA through the SiBAR for 10 minutes after which the TCF reduces from −22.13 ppm/° C. to −7.93 ppm/° C. Similar results can also be obtained using a degenerately boron doped SiBAR.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of trimming a resonant frequency of a micro-electromechanical resonator, comprising:
   heating a semiconductor resonator body having at least one mass-loading metal layer thereon for a first duration sufficient to convert at least a portion of the semiconductor resonator body into a eutectic alloy comprising metal from the at least one mass-loading metal layer;
   wherein at least a portion of the semiconductor resonator body is degenerately doped with boron.

2. The method of claim 1, wherein the semiconductor resonator body is anchored to a substrate on opposite sides thereof using a pair of supports; wherein said heating comprises passing a current through the pair of supports.

3. A method of fabricating a micro-electromechanical resonator, comprising:
   forming a degenerately boron-doped resonator body opposite a recess in a semiconductor substrate, said resonator body having an aluminum metal layer on a surface thereof;
   packaging the boron-doped resonator body within a sealed chamber that shares an ambient with the recess in the semiconductor substrate; and
   resistance heating the packaged boron-doped resonator body for a sufficient duration to convert at least a portion of the boron-doped resonator body into a eutectic alloy comprising aluminum from the aluminum metal layer.

4. The method of claim 3, wherein said forming comprises forming a degenerately boron-doped resonator body having first and second supports that anchor opposing sides of the boron-doped resonator body to the semiconductor substrate; and wherein said resistance heating comprises passing a current through the first and second supports.

5. A method of fabricating a micro-electromechanical resonator, comprising:
   forming a boron-doped monocrystalline silicon resonator body opposite a recess in a semiconductor substrate, said resonator body having an aluminum metal layer on a surface thereof;
   packaging the boron-doped resonator body within a sealed chamber that shares an ambient with the recess in the semiconductor substrate; and
   resistance heating the packaged boron-doped resonator body for a sufficient duration to convert a majority of the boron-doped resonator body into a eutectic alloy comprising aluminum from the aluminum metal layer and non-monocrystalline silicon.

6. A method of trimming a resonant frequency of a micro-electromechanical resonator, comprising:
   heating a boron-doped semiconductor resonator body having at least one mass-loading metal layer thereon for a first duration sufficient to convert at least a majority of the semiconductor resonator body into a eutectic alloy comprising metal from the at least one mass-loading metal layer.

7. The method of claim 6, wherein said heating comprises heating the boron-doped semiconductor resonator body at a temperature greater than about 360° C.

8. A method of trimming a resonant frequency of a micro-electromechanical resonator, comprising:
   heating a boron-doped monocrystalline silicon resonator body having at least one mass-loading metal layer thereon for a first duration sufficient to convert at least a majority of the monocrystalline silicon resonator body into a eutectic alloy comprising a combination of metal from the at least one mass-loading metal layer and non-monocrystalline silicon.

9. A method of increasing a resonant frequency of a micro-electromechanical resonator, comprising:
   heating a boron-doped semiconductor resonator body having at least one mass-loading metal layer thereon for a duration sufficient to convert at least a majority of the semiconductor resonator body into a eutectic alloy comprising metal from the at least one mass-loading metal layer.

10. The method of claim 9, wherein the at least one mass-loading metal layer comprises gold (Au).

11. The method of claim 10, wherein said heating comprises heating the boron-doped semiconductor resonator body at a temperature greater than about 360° C.

* * * * *